(12) United States Patent
Lagenwalter et al.

(10) Patent No.: US 10,318,662 B2
(45) Date of Patent: Jun. 11, 2019

(54) SYSTEMS AND METHODS FOR HORIZONTAL WELL CORRELATION AND GEOSTEERING

(75) Inventors: Richard J Lagenwalter, Lakewood, CO (US); Fred B. Poland, Littleton, CO (US); Tom C. Daffin, Denver, CO (US)

(73) Assignee: Landmark Graphics Corporation, Houston, TX (US)

( * ) Notice: Subject to any disclaimer, the term of this patent is extended or adjusted under 35 U.S.C. 154(b) by 447 days.

(21) Appl. No.: 13/699,514

(22) PCT Filed: May 21, 2010

(86) PCT No.: PCT/US2010/035883
§ 371 (c)(1),
(2), (4) Date: Feb. 4, 2013

(87) PCT Pub. No.: WO2011/146079
PCT Pub. Date: Nov. 24, 2011

(65) Prior Publication Data
US 2013/0238306 A1    Sep. 12, 2013

(51) Int. Cl.
*E21B 7/04*      (2006.01)
*E21B 47/09*     (2012.01)
*G06F 17/50*     (2006.01)

(52) U.S. Cl.
CPC .......... *G06F 17/5009* (2013.01); *E21B 7/046* (2013.01); *E21B 47/09* (2013.01)

(58) Field of Classification Search
None
See application file for complete search history.

(56) References Cited

U.S. PATENT DOCUMENTS

| 5,675,147  | A  | * | 10/1997 | Ekstrom et al. | 250/256 |
| 7,093,672  | B2 | * | 8/2006  | Seydoux et al. | 175/24 |
| 7,191,850  | B2 | * | 3/2007  | Williams       | 175/45 |
| 7,359,845  | B2 | * | 4/2008  | Kelfoun        | 703/10 |
| 2005/0140373 | A1 | * | 6/2005 | Li et al.      | 324/338 |
| 2006/0090934 | A1 |   | 5/2006 | Williams       |  |
| 2006/0161406 | A1 |   | 7/2006 | Kelfoun        |  |
| 2010/0076740 | A1 | * | 3/2010 | Kuchuk         | E21B 49/087 703/10 |
| 2010/0122847 | A1 | * | 5/2010 | Xia            | G01V 1/40 175/41 |
| 2011/0106514 | A1 | * | 5/2011 | Omeragic       | G01V 11/00 703/10 |

OTHER PUBLICATIONS de Chizelle, Anh-Ngoc Kuhn, S. Omar Alam, and Dominic P. McCann. "Real-Time Interactive Graphical Tools for Improving Geosteering Decision Making." SPE Petroleum Computer Conference. Society of Petroleum Engineers, 1997.*

(Continued)

*Primary Examiner* — Saif A Alhija
*Assistant Examiner* — Bijan Mapar
(74) *Attorney, Agent, or Firm* — Kilpatrick Townsend & Stockton LLP

(57) ABSTRACT

Systems and methods for horizontal well correlation and geosteering, which include using a correlated 2D model and updated 3D model to determine target lines from the end of a horizontal section of the wellbore to a target point in the formation.

26 Claims, 11 Drawing Sheets

(56) References Cited

OTHER PUBLICATIONS

The State Intellectual Property Office of the People's Republic of China; Notice on the First Office Action, Application No. 201080066747.7, dated Feb. 2, 2015, 14 pages, The State Intellectual Property Office of the People's Republic of China, China.
Tran, Chau; First Examination Report; dated Feb. 15, 2016; 4 pages; Patent Application No. 2796410; Canadian Intellectual Property Office; Canada.
Oates, Kirsten, M.;Response to Examiner's Report dated Feb. 15, 2016; dated May 20, 2016; 47 pages; Patent Application No. 2796410; Parlee McLaws; Calgary, Canada.
Canadian Patent Application No. 2,796,410, Office Action, dated Aug. 7, 2017, 3 pages.
European Patent Application No. 10851898.6, Extended European Search Report, dated Aug. 31, 2017, 13 pages.
Sperry-Sun, StrataSteer® 3D Service, A Fully Integrated Service for Optimizing the Well Trajectory in Real Time; 2004; 2 pgs.; Halliburton Communications; USA.
Eurasian Office Action/Translation; dated Aug. 28, 2014; 3 pgs.; The Eurasian Patent Organization.
Response to Eurasian Office Action; dated Dec. 28, 2014; 2 pgs.; ARS-Patent; Russia.
Ahmad, Khalid; Australian Office Action; dated Dec. 4, 2014; 3 pgs.; Australian Government, IP Australia; Wooden, Australia.
Koch, Lars; Response to Australian Office Action; dated Dec. 8, 2014; 18 pgs.; Pizzeys; Australia.

\* cited by examiner

SYSTEMS AND METHODS FOR HORIZONTAL WELL CORRELATION AND GEOSTEERING

CROSS-REFERENCE TO RELATED APPLICATIONS

The priority of PCT Patent Application No. PCT/US2010/035883, filed on May 21, 2010, is hereby claimed, and the specification thereof is incorporated herein by reference.

STATEMENT REGARDING FEDERALLY SPONSORED RESEARCH

Not applicable.

FIELD OF THE INVENTION

The present invention generally relates to horizontal well correlation and geosteering. More particularly, the present invention relates to updating a three-dimensional ("3D") modeled surface from a correlated two-dimensional ("2D") modeled surface used to guide (geosteer) the end of a horizontal section of a wellbore along a target line to the target formation.

BACKGROUND OF THE INVENTION

By some estimates, 80% of new oil and gas wells are horizontal wells. Horizontal wells are deviated wellbores, which include a horizontal section. Each of these must be accurately and efficiently geosteered because time is of the essence when drilling expensive deviated wellbores and a mistake in the geosteering (drilling) can be very costly if not potentially hazardous. Most geosteering applications are stand-alone 2D applications that are not integrated with a project database and 3D geo-model. In other words, they cannot take advantage of what a full 3D environment affords and it is difficult to incorporate the 2D interpretation back into the project database and geo-model. Most 2D geosteering applications must export the horizontal well correlation data in order to then import that data back into the project database, which is a time-consuming process. Additionally, conventional 2D geosteering applications cannot display a depth converted seismic backdrop that can be dynamically updated with new or additional seismic data. In fact, many conventional 2D geosteering applications cannot support multiple type logs (e.g. signature logs) that are used for correlating the horizontal section of the wellbore into variable geology. This deficiency can lead to inaccurate correlation and incorrect geosteering instructions.

TerraVu™ is one example of a 2D geosteering application, which is marketed by Terra Domain Consulting, that is limited to a single type log for correlation purposes. Moreover, TerraVu™ is a stand-alone 2D geosteering application that does not offer a dynamic depth converted seismic backdrop and must export its horizontal well correlation data in order to read that data into the project database.

Other geosteering applications like smartSECTION™ and BoreSight™ contain different limitations. For example, smartSECTION™, which is marketed by Landmark Graphics Corporation, has limited horizontal well correlation and geosteering capability and does not support 2D model building including apparent dip angle and fault offset manipulation along the wellbore.

There is therefore, a need for a more efficient and accurate means to guide the end of a horizontal section of the wellbore to the target formation using 2D and/or 3D modeled surfaces.

SUMMARY OF THE INVENTION

The present invention meets the above needs and overcomes one or more deficiencies in the prior art by providing systems and methods for guiding the end of a horizontal section of the wellbore to the target formation using a correlated 2D model to update a 3D model.

In one embodiment, the present invention includes a method for geosteering a wellbore, which comprises: a) initializing a 3D model and a 2D model using a computer processor, the 3D model representing an interpreted surface and the 2D model representing a straight line approximation of the interpreted surface; b) initializing an actual logging while drilling curve and a true vertical thickness type log, the actual logging while drilling curve representing formation measurements taken from within the wellbore and the true vertical thickness type log being calculated by projecting log responses parallel to the 2D model or the 3D model; c) initializing a true vertical thickness curve and a predicted logging while drilling curve, the true vertical thickness curve being calculated by converting the actual logging while drilling curve to a true vertical thickness depth index at each sample point and the predicted logging while drilling curve being calculated by a vertical distance the wellbore penetrates the 2D model or the 3D model at each sample point and extracting a value for the true vertical thickness type log at a stratigraphic position corresponding to each sample point below the 2D model or the 3D model; d) adjusting at least one of a dip or a fault offset for a section of the 2D model until a segment of the predicted logging while drilling curve is correlated with a corresponding segment of the actual logging while drilling curve or until a segment of the true vertical thickness curve is correlated with a corresponding segment of the true vertical thickness type log, the segment of the predicted logging while drilling curve that is correlated with the corresponding segment of the actual logging while drilling curve or the segment of the true vertical thickness curve that is correlated with the corresponding segment of the true vertical thickness type log representing a correlated segment; e) setting a marker at an end of the correlated segment, the marker separating a section of the 2D model that corresponds with the correlated segment from a remaining section of the 2D model; f) repeating steps d) and e) for the remaining section of the 2D model until an end of the wellbore is reached, the end of the wellbore corresponding with an end of the predicted logging while drilling curve and an end of the actual logging while drilling curve; g) updating the 3D model from the 2D model; and h) analyzing the 3D model to determine if the wellbore is on target.

In another embodiment, the present invention includes a non-transitory program carrier device tangibly carrying computer executable instructions for geosteering a wellbore. The instructions are executable to implement: a) initializing a 3D model and a 2D model, the 3D model representing an interpreted surface and the 2D model representing a straight line approximation of the interpreted surface; b) initializing an actual logging while drilling curve and a true vertical thickness type log, the actual logging while drilling curve representing formation measurements taken from within the wellbore and the true vertical thickness type log being calculated by projecting log responses parallel to the 2D model or the 3D model; c) initializing a true vertical thickness curve and a predicted logging while drilling curve, the true vertical thickness curve being calculated by converting the actual logging while drilling curve to a true vertical thickness depth index at each sample point and the predicted logging while drilling curve being calculated by a vertical distance the wellbore penetrates the 2D model or the 3D model at each sample point and extracting a value for the true vertical thickness type log at a stratigraphic position corresponding to each sample point below the 2D model or the 3D model; d) adjusting at least one of a dip or a fault offset for a section of the 2D model until a segment of the predicted logging while drilling curve is correlated with a corresponding segment of the actual logging while drilling curve or until a segment of the true vertical thickness curve is correlated with a corresponding segment of the true vertical thickness type log, the segment of the predicted logging while drilling curve that is correlated with the corresponding segment of the actual logging while drilling curve or the segment of the true vertical thickness curve that is correlated with the corresponding segment of the true vertical thickness type log representing a correlated segment; e) setting a marker at an end of the correlated segment, the marker separating a section of the 2D model that corresponds with the correlated segment from a remaining section of the 2D model; f) repeating steps d) and e) for the remaining section of the 2D model until an end of the wellbore is reached, the end of the wellbore corresponding with an end of the predicted logging while drilling curve and an end of the actual logging while drilling curve; g) updating the 3D model from the 2D model; and h) analyzing the 3D model to determine if the wellbore is on target.

In yet another embodiment, the present invention includes a non-transitory program carrier device tangibly carrying a data structure, the data structure comprising: i) a first data field comprising of vertical section, the vertical section comprising a wellbore, a 3D model and a 2D model, the 3D model representing an interpreted surface and the 2D model representing a straight line approximation of the interpreted surface; ii) a second data field comprising a horizontal panel, the horizontal panel comprising an actual logging while drilling curve and a predicted logging while drilling curve, the actual logging while drilling curve representing formation measurements taken from within the wellbore and the predicted logging while drilling curve being calculated by a vertical distance the wellbore penetrates the 2D model or the 3D model at each sample point and extracting a value for the true vertical thickness type log at a stratigraphic position corresponding to each sample point below the 2D model or the 3D model; and iii) a third data field comprising a vertical panel, the vertical panel comprising a true vertical thickness type log and a true vertical thickness curve, the true vertical thickness type log being calculated by projecting log responses parallel to the 2D model or the 3D model and the true vertical thickness curve being calculated by converting the actual logging while drilling curve to a true vertical thickness depth index at each sample point.

Additional aspects, advantages and embodiments of the invention will become apparent to those skilled in the art from the following description of the various embodiments and related drawings.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

The present invention is described below with references to the accompanying drawings in which like elements are referenced with like reference numerals, and in which.

DETAILED DESCRIPTION OF THE PREFERRED EMBODIMENTS

The subject matter of the present invention is described with specificity, however, the description itself is not intended to limit the scope of the invention. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the following description refers to the oil and gas industry, the systems and methods of the present invention are not limited thereto and may also be applied to other industries to achieve similar results.

Method Description

Figure 1:
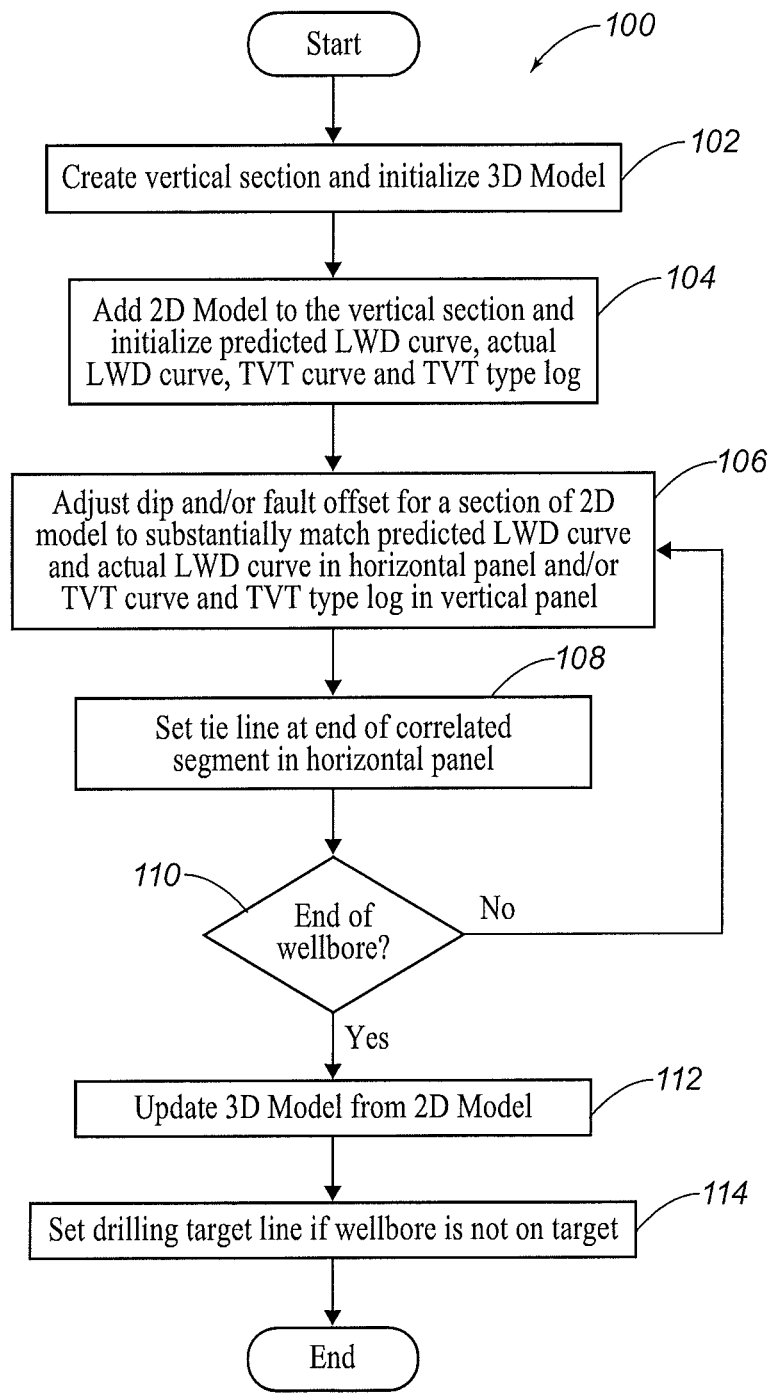
FIG. 1 is a flow diagram illustrating one embodiment of a method for implementing the present invention.

Referring now to FIG. 1, a flow diagram illustrates one embodiment of a method 100 for implementing the present invention. The method 100 represents a workflow that may be fully integrated with a project database and is supported by a full 3D environment and topology engine. As a result, geometry and log attribute information can be extracted from a 3D model, also referred to as a 3D modeled surface or a 3D geomodel, to generate predicted logging-while drilling ("LWD") log responses. Moreover, different type logs may be incorporated into the workflow as the horizontal section of the wellbore is extended into variable geology. Actual well logs represent formation measurements taken by logging instruments while drilling a wellbore. The formation measurements represent log responses, which are typically illustrated in the form of a curve.

In step 102, a vertical section is created and a 3D model is initialized using a graphical user interface and techniques well known in the art. The vertical section may be created, for example, using smartSECTION™. Likewise, the 3D model may be initialized using a 3D topology engine and a 3D model (interpreted surface) included in smartSEC-TION™. SmartSECTION™ includes FrameBuilder™, which is a 3D topology engine built into the smartSEC-TION™ application and initializes the 3D model by triangulating surfaces based upon formation depths stored in the project database. Data from surrounding wells may also be used by FrameBuilder™ to triangulate formation surfaces displayed in the vertical section. As illustrated by the graphical user interface 200 in FIG. 2, a vertical section 202 includes a cross-section of the wellbore 204, a surface of the target formation 206 (shown in red), and a surface of the 3D model 208 (shown in green). The wellbore 204 includes an end 226 located between the 3D model 208 and the target formation 206 in the vertical section 202. The wellbore 204 also includes a point representing the lowest true vertical depth ("TVD") of the wellbore 204, which is represented by TVD point 220. The vertical section 202 therefore, illustrates a cross-section of the wellbore 204 along a plan view of the horizontal reach of the wellbore 204, which also intersects the target formation 206 and the 3D model 208.

Figure 3:
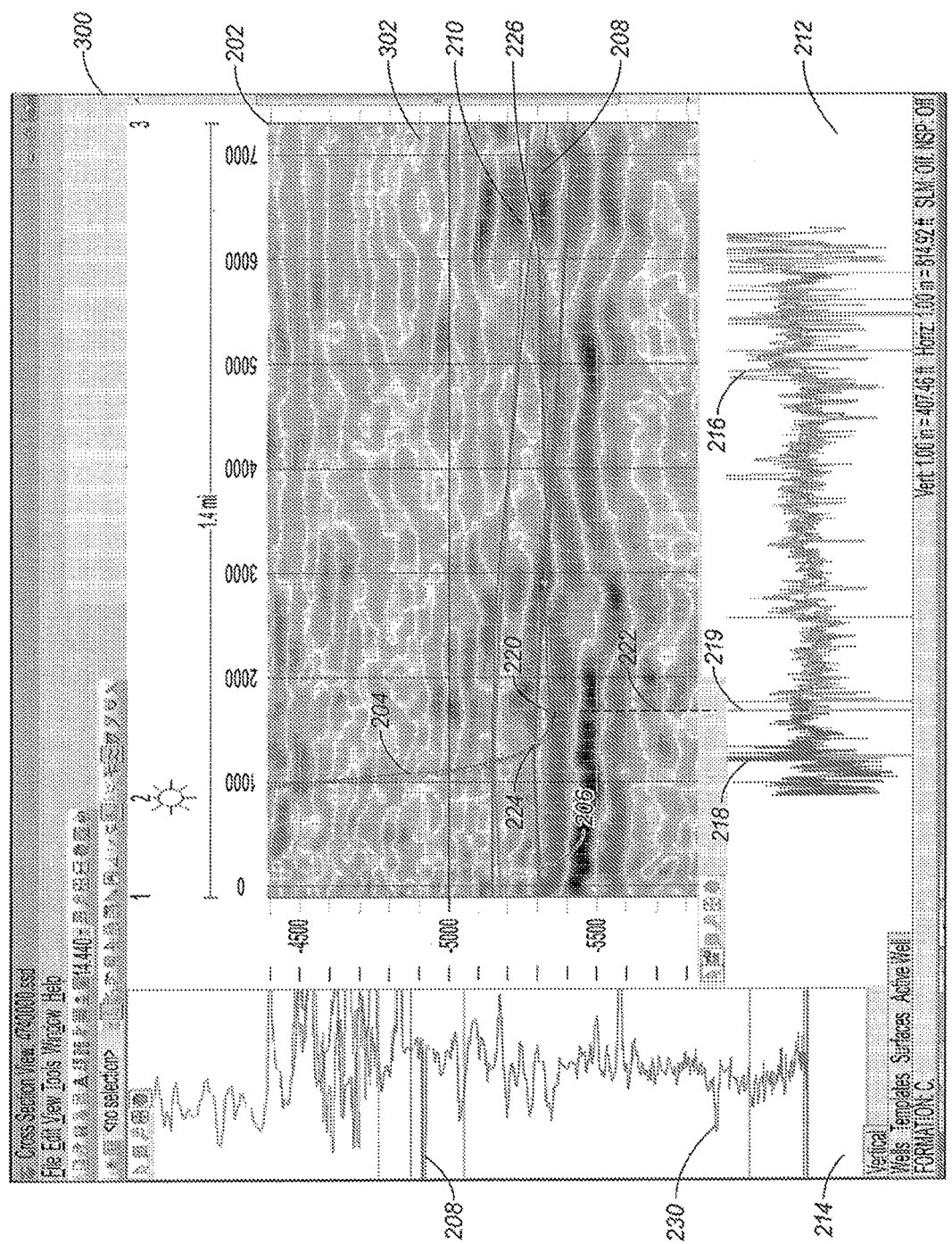
FIG. 3 illustrates a graphical user interface for displaying the vertical section, the horizontal panel, the vertical panel and a dynamically depth converted seismic backdrop according to the present invention.
Figure 4:
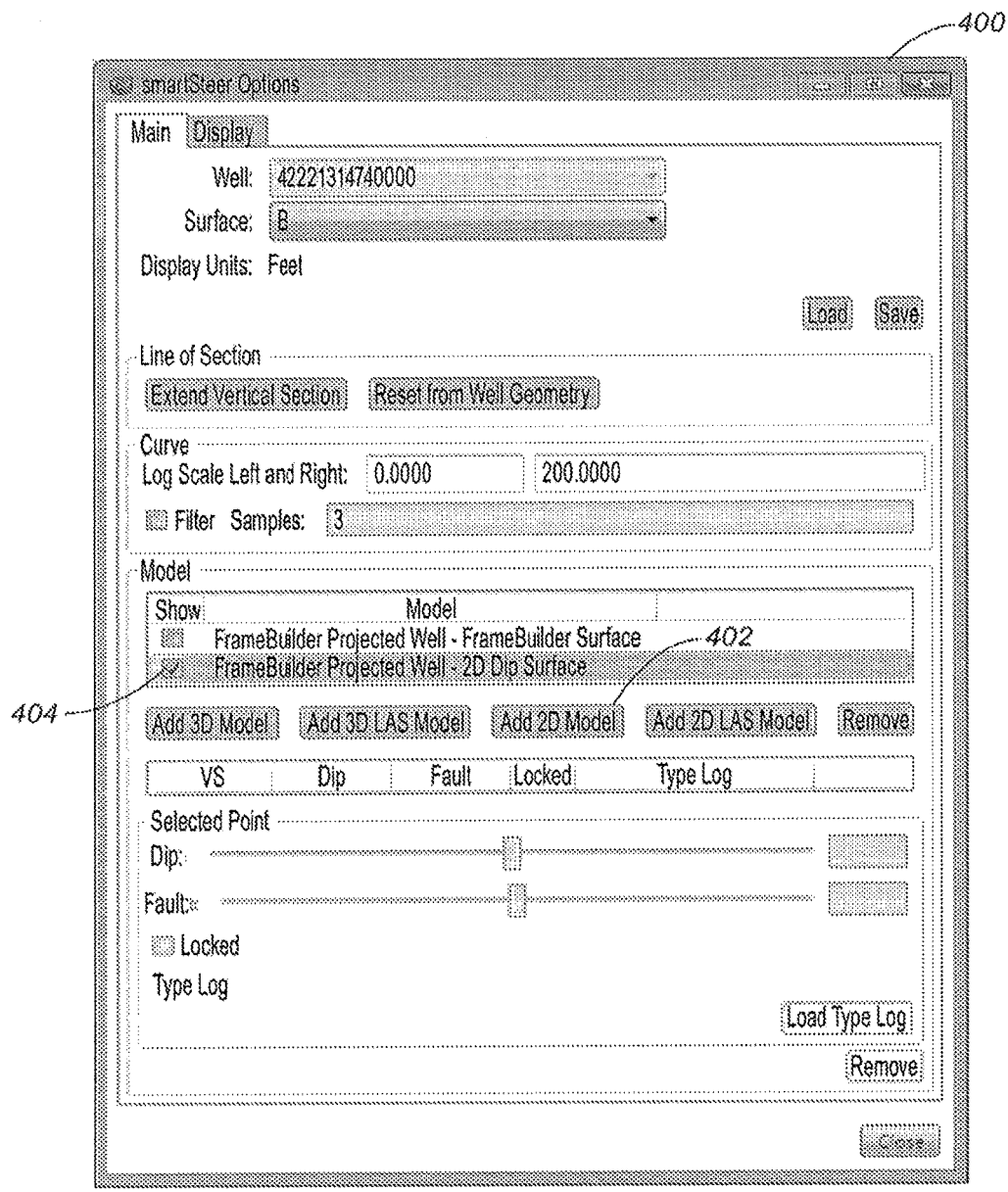
FIG. 4 illustrates a graphical user interface for adding a 2D model to the vertical section in FIG. 2 or 3.

In step 104, a 2D model is added to the vertical section using a graphical user interface and techniques well known in the art. The 2D model is added by initializing a straight line, preferably horizontal, on the vertical section. As illustrated by the graphical user interface 300 in FIG. 3, seismic data 302 may also be added to the vertical section 202 in order to provide a more accurate correlation of the 2D model for updating the 3D model. The seismic data 302 may be dynamically depth converted based upon a velocity model, which is generally referred to as a depth converted seismic backdrop, using techniques well known in the art. The graphical user interface 400 in FIG. 4, for example, may be used to add the 2D model 210 to the vertical section 202 by selecting box 402.

Figure 2:
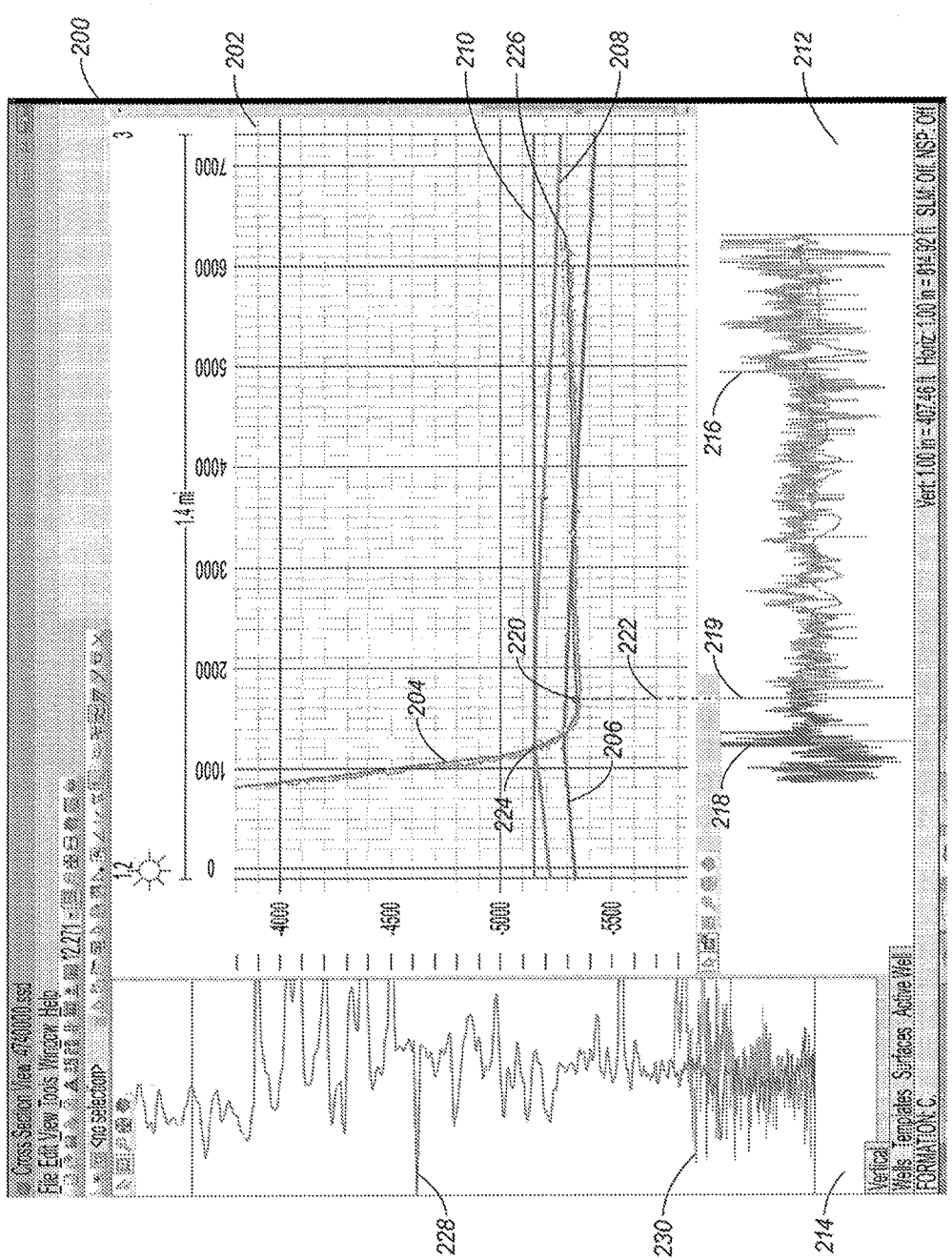
FIG. 2 illustrates a graphical user interface for displaying a vertical section, a horizontal panel and a vertical panel according to the present invention.

In FIG. 2, the 2D model 210 (shown in purple) is displayed in the vertical section 202 as a cross-section of the 2D modeled surface. Also illustrated in FIG. 2 is a horizontal panel 212 and a vertical panel 214. The horizontal panel 212 includes an actual LWD curve 216 and a predicted LWD curve 218, which are also initialized in step 104. The actual LWD curve 216 is shown in red and the predicted LWD curve 218 is shown in blue. An end 219 of a correlated section of the actual LWD curve 216 and the predicted LWD curve 218 is aligned with TVD point 220 as demonstrated by the dashed line 222. The remaining actual LWD curve 216 and predicted LWD curve 218 to the right of the end 219 of the correlated section is not correlated. An anchor point 224 represents the intersection of the wellbore 204 with the 2D model 210 and the 3D model 208. The type log is generated from the region left of TVD point 220. Thus, the actual LWD curve 216 and the predicted LWD curve 218 overlay each other and correlate perfectly. The vertical panel 214 includes a true vertical thickness ("TVT") type log 228 for correlation purposes and a TVT curve 230 of the actual LWD curve 216, which are also initialized in step 104. The TVT type log 228 is shown in blue and the TVT curve 230 is shown in red. Other type logs from nearby wells, however, may be incorporated into the work flow as the horizontal section of the wellbore 204 is extended into variable geology. The actual LWD curve 216 represents formation measurements taken by logging instruments while drilling the wellbore 204. The predicted LWD curve 218 is determined by calculating the vertical distance that the wellbore 204 penetrates the modeled stratigraphic formation at each sample point in the horizontal section of the wellbore 204. A calculation is then performed using techniques well known in the art at each sample point (i.e. measured depth) to determine the value of the predicted LWD curve 218 at the corresponding stratigraphic position of the TVT type log. The value of the predicted LWD curve 218 at each sample point is therefore, derived by calculating the amount of vertical penetration between the active surface (e.g. 2D model 210) and the wellbore 204, and extracting the value of the TVT type log 228 at that stratigraphic position below the active surface on the TVT type log 228. The TVT curve 230 is calculated by converting the actual LWD curve 216 to a TVT depth index at each sample point.

Figure 5:
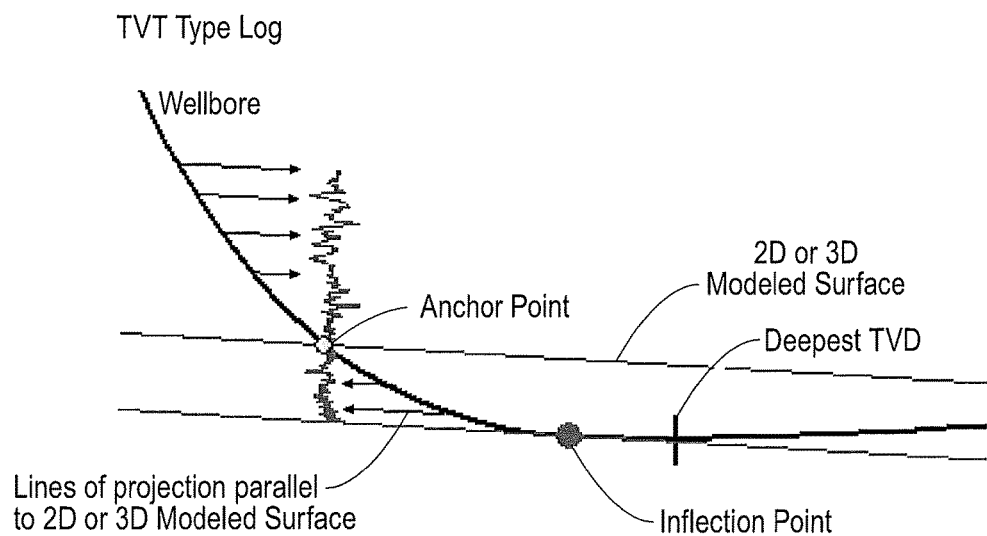
FIG. 5 is a schematic diagram illustrating the calculation of a TVT type log using a 2D and/or a 3D modeled surface.

Referring now to FIG. 5, a schematic view illustrates the calculation of a TVT type log using a 2D and/or 3D modeled surface. Due to the non linear effects of wellbore curvature in the horizontal section of a wellbore, TVT type logs provide substantial improvement over conventional type logs that simply project horizontally without surface information. In the TVT type log calculation, the 2D and 3D modeled surfaces guide the projection of the TVT type log. As illustrated in FIG. 5, the projection follows the surfaces' apparent dip at each point along the wellbore and removes the effects of wellbore curvature. Thus, TVT type logs are calculated by projecting log responses parallel to the 2D and/or 3D modeled surfaces. The projection angle equals the guiding surfaces' apparent dip relative to the wellbore. TVT corrections are greatest when formation surfaces are dipping significantly as the wellbore curves to horizontal (90 degree inclination) or greater at or near a wellbore's deepest total vertical depth or "sump," which is the lowest point of the wellbore used to collect fluids. An anchor point represents the intersection of the guiding 2D or 3D modeled surface with the wellbore. The anchor point sets the TVT hangpoint position where the TVT stretch or squeeze correction is always zero. The TVT type log is created by projecting log measurements parallel to the apparent dip of the surface(s) above the anchor point to the right and below the anchor point to the left. An inflection point, which is the position where the wellbore transitions from stratigraphic down dip to up dip, is determined by calculating the deepest stratigraphic position of the wellbore relative to the formation surface. The inflection point is also the position where the wellbore inclination tangentially matches the surface apparent dip. As the guiding surface changes dip, the inflection point position also changes position to maintain its tangential position along the wellbore.

Figures 8A, 8B, 8C:
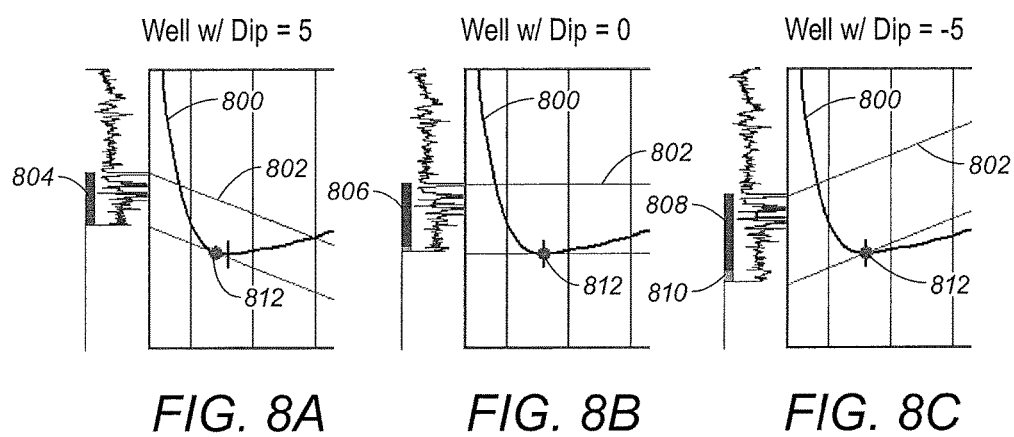
FIG. 8A is a schematic diagram illustrating compression of a TVT type log interval after adjusting for relative negative dip of the 2D model.
FIG. 8B is a schematic diagram illustrating equivalent TVT and TVD type log intervals where the dip of the 2D model is flat.
FIG. 8C is a schematic diagram illustrating extension of the TVT type log interval after adjusting for relative positive dip of the 2D model.

Referring now to FIGS. 8A-8C, three different schematic diagrams illustrate how a change in the dip of the 2D model (guiding surface) stretches or squeezes the TVT type log interval. In FIG. 8A, for example, the 2D model 802 dips in the direction of the wellbore 800 resulting in compression of the TVT type log interval 804. In FIG. 8B, the 2D Model 802 has no dip and the TVT type log intervals 806 is projected horizontally. In FIG. 8C, the wellbore 800 and the 2D model 802 have oblique dips resulting in a stretched TVT type log interval 808 and an additional interval 810 as the inflection point 812 moves downhole.

Because the guiding surface for the 2D model is initially set to an apparent dip equal to zero (i.e. horizontal), the dip for the 2D model can be quickly and easily varied, and therefore, effectively rotates the inflection point around the wellbore heel position. Dip changes interactively update the TVT type log and the resulting predicted LWD curves. Apparent dip is established when the predicted LWD curve and the actual LWD curve overlay in the region right of the wellbore inflection point as the wellbore traverses back up the drilled formation. Once the apparent dip and the TVT type log are established at the inflection point, the interpretation proceeds downhole using the remaining 2D model in sections.

Figure 6:
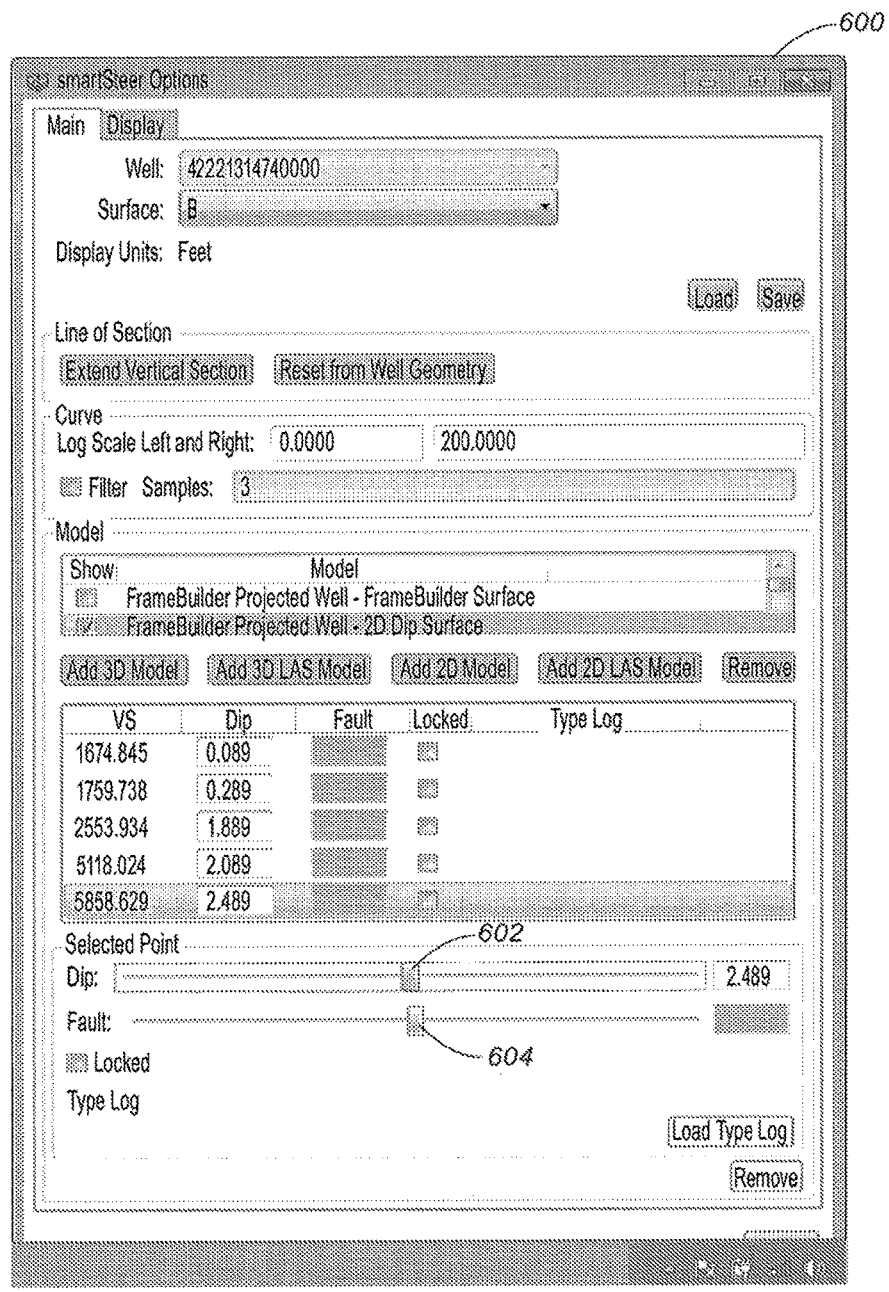
FIG. 6 illustrates a graphical user interface for adjusting the dip and/or fault offset for a 2D model or a 3D model.

In step 106, the dip and/or fault offset for the 2D model is adjusted using a graphical user interface to substantially match the predicted LWD curve and the actual LWD curve and/or to substantially match the TVT curve and the TVT type log. The graphical user interface 600 in FIG. 6 includes, for example, a dip slider bar 602 and a fault slider bar 604 that may be interactively moved to adjust the dip and fault offset, respectively, for the 2D model 210. As illustrated by the graphical user interface 700 in FIG. 7, the dip slider bar 602 in FIG. 6 was adjusted to alter the dip for multiple sections of the 2D model 210. In this manner, the wellbore may be incrementally correlated with the 2D model 210 by adjusting the dip and/or fault offset for a section of the 2D model 210 until a segment of the predicted LWD curve 218 substantially matches a corresponding segment of the actual LWD curve 216 in the horizontal panel 212 and/or until a segment of the TVT curve 230 substantially matches a corresponding segment of the TVT type log 228 in the vertical panel 214. Once a segment of the predicted LWD curve 218 substantially matches a corresponding segment of the actual LWD curve 216 and/or a segment of the TVT curve 230 substantially matches a corresponding segment of the TVT type log 228, they are correlated and collectively represent a correlated segment. This correlation process is preferably done on a segment by segment basis as the wellbore 204 is progressively drilled. Although the foregoing correlation process can be accomplished by adjusting the modeled surfaces in the 3D model 208, it is much easier to adjust the 2D model 210 using the same dip slider bar 602 and/or fault slider bar 604 in FIG. 6 and then update the 3D model 208 from the 2D model 210.

Figure 7:
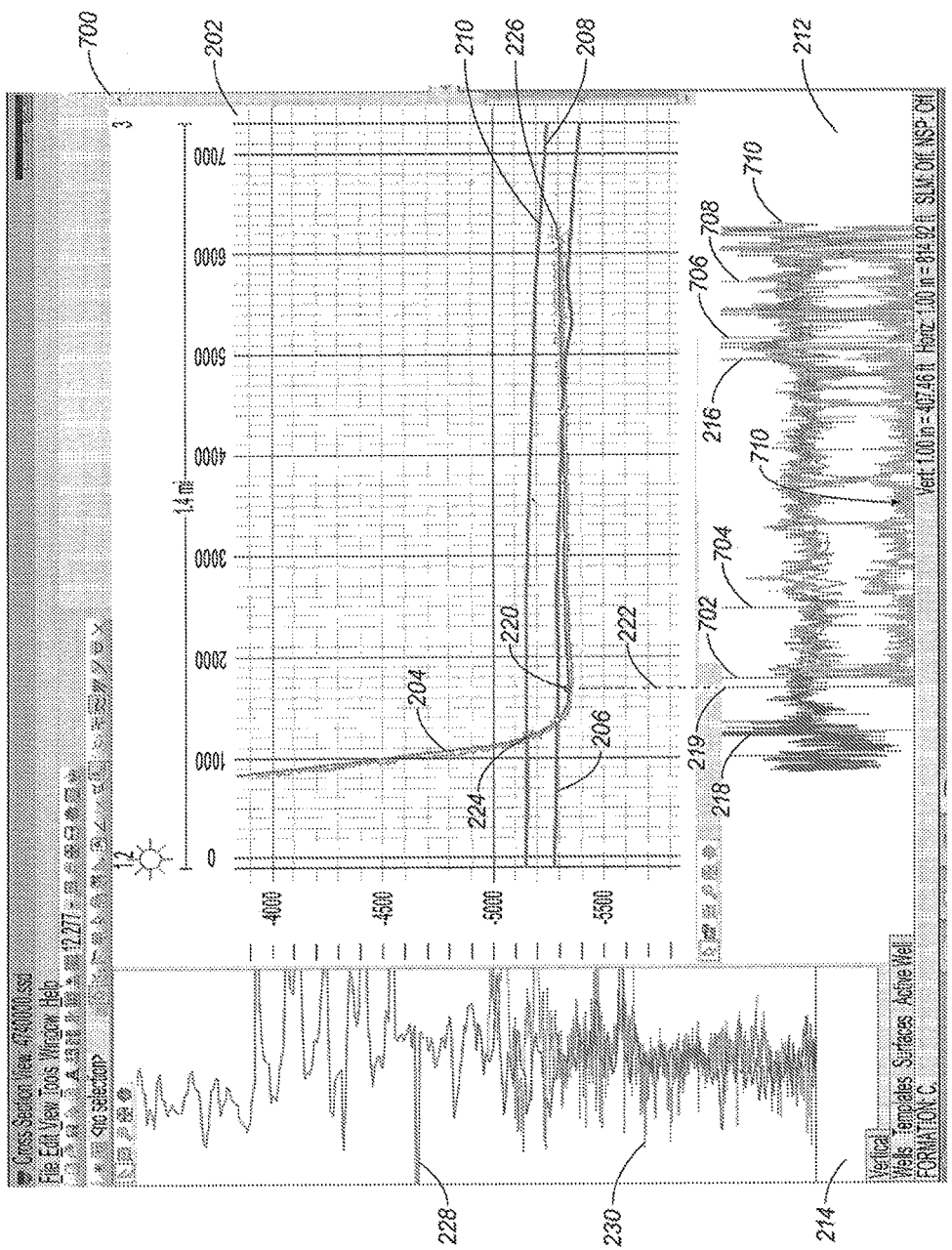
FIG. 7 illustrates a graphical user interface for displaying the vertical section, the horizontal panel and the vertical panel after the dip for a 2D model in the vertical section is adjusted.

In step 108, a tie line (marker) is set at the end of the correlated segment in the horizontal panel using a graphical user interface. The graphical user interface 700 in FIG. 7 illustrates a tie line 702, which marks the end of the first correlated segment (from step 106) and the beginning of the next correlated segment in the horizontal panel 212. Typically, a tie line may be set at any position on the predicted LWD curve and the actual LWD curve where it is determined that the predicted LWD curve and the actual LWD curve no longer substantially match and begin to diverge; however, the placement of tie lines is not limited to this case only and can be added at any other position preferred. The tie line effectively separates a section of the 2D model that corresponds with a correlated segment from a remaining section of the 2D model. The section of the 2D model 210 that corresponds with the first correlated segment in FIG. 7 lies between a point on the 2D model 210 that is intersected by a line (not shown) that also intersects TVD Point 220, and another point on the 2D model 210 that is intersected by a line (not shown) that is aligned with tie line 702.

In step 110, the method 100 determines if the end of the wellbore has been reached. If the end of the wellbore has been reached, then the method 100 proceeds to step 112. If the end of the wellbore has not been reached, then the method 100 returns to step 106 where the dip and/or fault offset may be adjusted for the remaining section of the 2D model. The correlation in step 106 is therefore, repeated, segment by segment, until the end 226 of the wellbore 204 is reached, which corresponds with an end 710 of the actual LWD curve 216 and the predicted LWD curve 218. As step 106 is repeated for the remaining section of the 2D model, each adjustment of the dip and/or the fault offset for the remaining section of the 2D model will not effect each correlated segment and each section of the 2D model that corresponds with a respective correlated segment from each prior iteration of step 106. In FIG. 7, for example, each correlated segment is separated from another correlated segment by a tie line (702, 704, 706, 708). The section of the 2D model 210 that corresponds with the next correlated segment in FIG. 7 therefore, lies between a point on the 2D model that is intersected by a line (not shown) that is aligned with tie line 702, and another point on the 2D model 210 that is intersected by a line (not shown) that is aligned with tie line 704. A correlation curve 712 is optionally included in the horizontal panel 212 of FIG. 7 to illustrate the cross correlation coefficient or goodness of fit between the actual LWD curve 216 and the predicted LWD curve 218.

Figure 9:
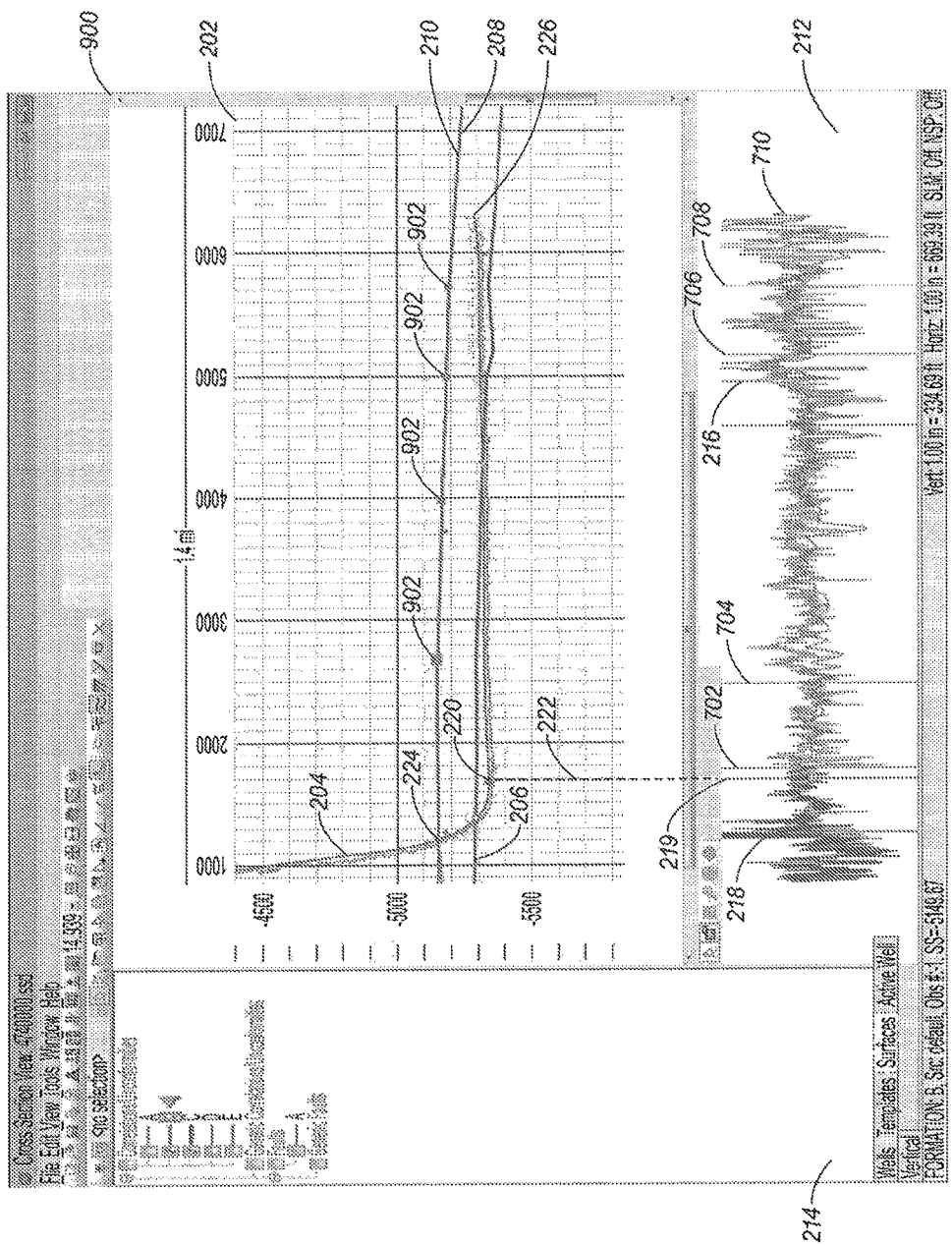
FIG. 9 illustrates a graphical user interface for displaying the vertical section and a 3D model after it is updated from the 2D model.

In step 112, the 3D model is updated from the 2D model using a graphical user interface. As illustrated by the graphical user interface 900 in FIG. 9, interwell hardpoints 902 are used to interactively drag the 3D model 208 to the 2D model 210 by positioning the interwell hardpoints 902 on the 3D model 208 and moving each one to the 2D model 210. In this manner, the 3D model may be interactively adjusted (updated) to fit the 2D model at each interwell hardpoint 902 once the 2D model is correlated in the manner described in reference to steps 106, 108 and 110. In other words, the 3D model 208 can be updated to match the geometry of the correlation points of the 2D model 210. Nevertheless, each interwell hard point may be placed at any preferred position on the 3D model. As illustrated in FIG. 9, the 2D model 210 and the 3D model 208 are virtually aligned and indistinguishable. The updated 3D Model 208 may be analyzed to determine if the wellbore 204 is or target—meaning that it is either being drilled toward the target formation 206 or that it has already entered the target formation 206. Furthermore, the analysis of the updated 3D model 208 may result in maintaining the drilling direction (on-target), setting a drilling target line (step 114) or returning to step 106 to refine the correlation.

Figure 10:
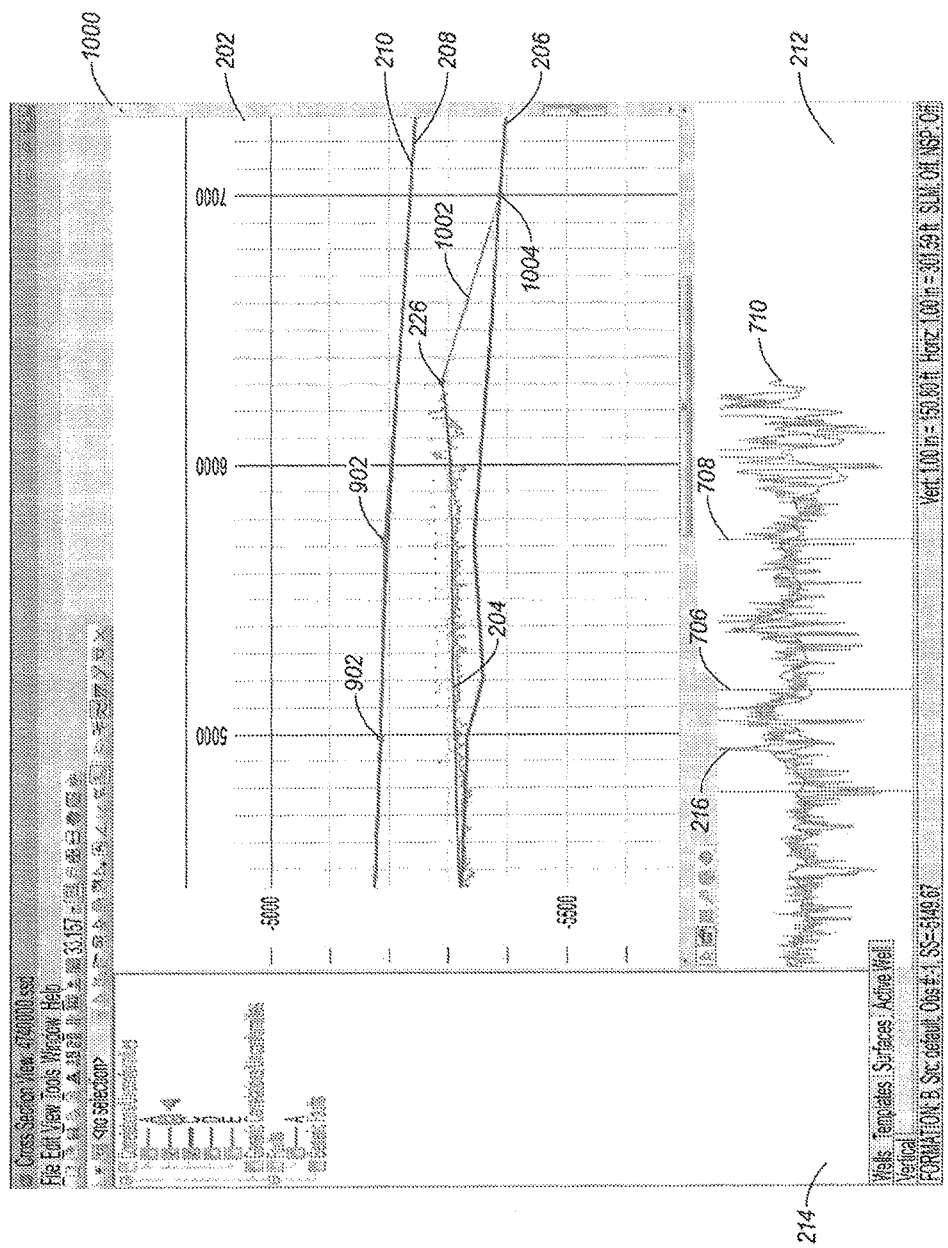
FIG. 10 illustrates a graphical user interface for displaying the vertical section, the 3D model after it is updated and a drilling target line.

In step 114, a drilling target line is set using a graphical user interface and the updated 3D model if the wellbore is not on target. As illustrated by the graphical user interface 1000 in FIG. 10, the target line 1002 is set by drawing a line beginning at the end 226 of the wellbore 204 to a target point 1004 some predetermined distance in front of the horizontal section of the wellbore 204 such as, for example, the target formation 206. The target line 1002 persists on the cross-section and is updated with a new target line every time the well is drilled to a new position. The distance, angle and other information related to each target line may be stored for directing the horizontal section of the wellbore 204 to the next target point. Because the target formation 206 is automatically adjusted when the 3D model 208 is updated, the location of the target point 1004 and the distance, angle and other related information for the target line 1002 are dependent on the subsequently updated 3D model 208.

System Description

The present invention may be implemented through a computer-executable program of instructions, such as program modules, generally referred to as software applications or application programs executed by a computer. The software may include, for example, routines, programs, objects, components, and data structures that perform particular tasks or implement particular abstract data types. The software forms an interface to allow a computer to react according to a source of input. SmartSECTION™ may be used as an interface application to implement the present invention. The software may also cooperate with other code segments to initiate a variety of tasks in response to data received in conjunction with the source of the received data. The software may be stored and/or carried on any variety of memory media such as CD-ROM, magnetic disk, bubble memory and semiconductor memory (e.g., various types of RAM or ROM). Furthermore, the software and its results may be transmitted over a variety of carrier media such as optical fiber, metallic wire and/or through any of a variety of networks such as the Internet.

Moreover, those skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof, in a computer system or other processing system.

Figure 11:
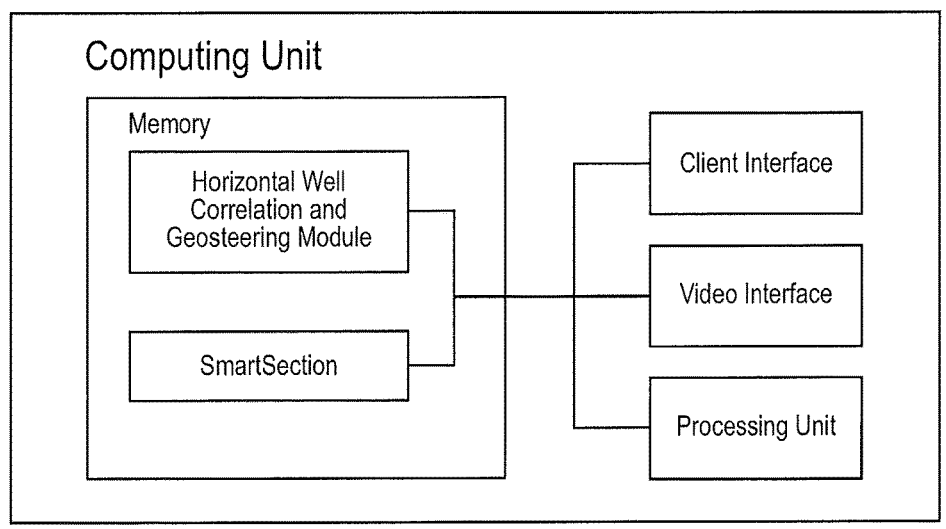
FIG. 11 is a block diagram illustrating one embodiment of a system for implementing the present invention.

Referring now to FIG. 11, a block diagram of a system for implementing the present invention on a computer is illustrated. The system includes a computing unit, sometimes referred to as a computing system, which contains memory, application programs, a client interface, a video interface and a processing unit. The computing unit is only one example of a suitable computing environment and is not intended to suggest any limitation as to the scope of use or functionality of the invention.

The memory primarily stores the application programs, which may also be described as program modules containing computer-executable instructions, executed by the computing unit for implementing the present invention described herein and illustrated in FIGS. 1-10. The memory therefore, primarily includes a horizontal well correlation and geosteering module, which enables the methods illustrated and described in reference to FIGS. 1-10. The smartSECTION™ application interfaces with the horizontal well correlation and geosteering module and includes a 3D environment, a project database and the FrameBuilder™ topology engine.

Although the computing unit is shown as having a generalized memory, the computing unit typically includes a variety of computer readable media. By way of example, and not limitation, computer readable media may comprise computer storage media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through application program interface ("API"), which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present invention has been described in connection with presently preferred embodiments, it will be understood by those skilled in the art that it is not intended to limit the invention to those embodiments. Although the illustrated embodiments of the present relate to oil and gas wells, the present invention may be applied to any other type of well and other fields and disciplines. It is therefore, contemplated that various alternative embodiments and modifications may be applied to the disclosed embodiments without departing from the spirit and scope of the invention defined by the appended claims and equivalents therefore.

The invention claimed is:

1. A method comprising:
   initializing, using a computer processor, a three-dimensional ("3D") model and a two-dimensional ("2D") model of a subterranean formation through which a wellbore is formed, the 3D model representing an interpreted surface of the subterranean formation that defines the wellbore and the 2D model representing a straight line approximation of the interpreted surface;
   initializing an actual logging while drilling ("LWD") curve representing measurements taken from within the wellbore;
   initializing a predicted true vertical thickness ("TVT") log representing data calculated by projecting log responses parallel to the 2D model or the 3D model;
   initializing an actual TVT curve representing data calculated by converting the actual LWD curve to a TVT depth index at each sample point;
   initializing a predicted LWD curve calculated by a vertical distance that the wellbore penetrates the 2D model or the 3D model at each sample point and extracting a value for the predicted TVT log at a stratigraphic position corresponding to each sample point below the 2D model or the 3D model;
   for a remaining section of the 2D model until an end of the wellbore is reached, the end of the wellbore corresponding with an end of the predicted LWD curve and an end of the actual LWD curve:
      adjusting at least one of a dip or a fault offset for a section of the 2D model until a segment of the predicted LWD curve is correlated with a corresponding segment of the actual LWD curve or until a segment of the actual TVT curve is correlated with a corresponding segment of the predicted TVT log, the segment of the predicted LWD curve that is correlated with the corresponding segment of the actual LWD curve or the segment of the actual TVT curve that is correlated with the corresponding segment of the predicted TVT log representing a correlated segment; and
      setting a marker at an end of the correlated segment, the marker separating a section of the 2D model that corresponds with the correlated segment from the remaining section of the 2D model;
   updating the 3D model from the 2D model;
   analyzing the 3D model to determine if the wellbore is on target; and
   controlling steering of a wellbore drilling operation in response to the updated 3D model determining the wellbore is not on target.

2. The method of claim 1, wherein initializing the 2D model comprises initializing the 2D model to represent a horizontal line.

3. The method of claim 1, wherein setting the marker at the end of the correlated segment comprises setting the marker at a position on the predicted LWD curve and the actual LWD curve where the predicted LWD curve and the actual LWD curve are no longer correlated and begin to diverge.

4. The method of claim 1, further comprising initializing a correlation curve to determine a cross-correlation coefficient between the actual LWD curve and the predicted LWD curve.

5. The method of claim 1, wherein updating the 3D model comprises:
   positioning one or more interwell hardpoints on the 3D model; and
   moving each interwell hardpoint to the 2D model.

6. The method of claim 5, wherein updating the 3D model interactively adjusts the 3D model to fit the 2D model at each interwell hardpoint.

7. The method of claim 1, further comprising setting a target line for the wellbore in response to the wellbore being not on target.

8. The method of claim 7, wherein setting the target line for the wellbore comprises drawing a line from an end of the wellbore to a target point a predetermined distance ahead of the wellbore.

9. The method of claim 8, wherein setting the target line for the wellbore comprises determining the target point is a target formation.

10. The method of claim 9, wherein determining the target point is the target formation comprises automatically adjusting the target formation when the 3D model is updated.

11. A non-transitory computer-readable medium in which instructions executable by a processing device are stored for causing the processing device to:
    initialize a three-dimensional ("3D") model and a two-dimensional ("2D") model of a subterranean formation through which a wellbore is formed, the 3D model representing an interpreted surface of the subterranean formation that defines the wellbore and the 2D model representing a straight line approximation of the interpreted surface;
    initialize an actual logging while drilling ("LWD") curve representing formation measurements taken from within the wellbore;
    initialize a predicted true vertical thickness ("TVT") log representing data calculated by projecting log responses parallel to the 2D model or the 3D model;
    initialize an actual TVT curve by converting the actual LWD curve to a TVT depth index at each sample point;
    initialize a predicted LWD curve by calculating a vertical distance that the wellbore penetrates the 2D model or the 3D model at each sample point and extracting a value for the predicted TVT log at a stratigraphic position corresponding to each sample point below the 2D model or the 3D model;
    for a remaining section of the 2D model until an end of the wellbore is reached, the end of the wellbore corresponding with an end of the predicted LWD curve and an end of the actual LWD curve:
       adjust at least one of a dip or a fault offset for a section of the 2D model until a segment of the predicted LWD curve is correlated with a corresponding segment of the actual LWD curve or until a segment of the actual TVT curve is correlated with a corresponding segment of the predicted TVT log, the segment of the predicted LWD curve that is correlated with the corresponding segment of the actual LWD curve or the segment of the actual TVT curve that is correlated with the corresponding segment of the predicted TVT log representing a correlated segment; and
       set a marker at an end of the correlated segment, the marker separating a section of the 2D model that corresponds with the correlated segment from the remaining section of the 2D model;
    update the 3D model from the 2D model;
    analyze the 3D model to determine if the wellbore is on target; and control steering of a wellbore drilling operation in response to the updated 3D model determining the wellbore is not on target.

12. The non-transitory computer-readable medium of claim 11, wherein the instructions for causing the processing device to initialize the 2D model comprises instructions for causing the processing device to initialize the 2D model to represent a horizontal line.

13. The non-transitory computer-readable medium of claim 11, wherein the instructions for causing the processing device to set the marker at the end of the correlated segment comprises instructions for causing the processing device to set the marker at a position on the predicted LWD curve and the actual LWD curve where the predicted LWD curve and the actual LWD curve are no longer correlated and begin to diverge.

14. The non-transitory computer-readable medium of claim 11, wherein the instructions are further for causing the processing device to initialize a correlation curve to determine a cross-correlation coefficient between the actual LWD curve and the predicted LWD curve.

15. The non-transitory computer-readable medium of claim 11, wherein the instructions for causing the processing device to update the 3D model comprises instructions for causing the processing device to: position one or more interwell hardpoints on the 3D model; and move each interwell hardpoint to the 2D model.

16. The non-transitory computer-readable medium of claim 15, wherein the instructions for causing the processing device to update the 3D model further comprises instructions for causing the processing device to interactively adjusts the 3D model to fit the 2D model at each interwell hardpoint.

17. The non-transitory computer-readable medium of claim 11, wherein the instructions are further executable by the processing device for causing the processing device to set a target line for the wellbore based on the wellbore being not on target.

18. The non-transitory computer-readable medium of claim 17, wherein the instructions for causing the processing device to set the target line for the wellbore comprises instructions for causing the processing device to draw a line from an end of the wellbore to a target point a predetermined distance ahead of the wellbore.

19. The non-transitory computer-readable medium of claim 18, wherein the instructions for causing the processing device to draw the line from an end of the wellbore to the target point comprises instructions for causing the processing device to determine the target point is a target formation.

20. The non-transitory computer-readable medium of claim 19, wherein the instructions for causing the processing device to determine the target point is the target formation comprises instructions for causing the processing device to automatically adjust the target formation in response to the 3D model being updated.

21. A non-transitory computer-readable medium in which instructions executable by a processing device are stored for causing the processing device to:
generate a first data field comprising of vertical section, the vertical section comprising a wellbore, a three-dimensional ("3D") model and a two-dimensional ("2D") model of a subterranean formation through which a wellbore is formed, the 3D model representing an interpreted surface of the subterranean formation that defines the wellbore and the 2D model representing a straight line approximation of the interpreted surface;
generate a second data field comprising a horizontal panel, the horizontal panel comprising:
an actual logging while drilling ("LWD") curve representing formation measurements taken from within the wellbore; and
a predicted LWD curve being calculated by a vertical distance that the wellbore penetrates the 2D model or the 3D model at each sample point and extracting a value for a predicted true vertical thickness ("TVT") log at a stratigraphic position corresponding to each sample point below the 2D model or the 3D model;
generate a third data field comprising a vertical panel, the vertical panel comprising:
the predicted TVT log being calculated by projecting log responses parallel to the 2D model or the 3D model; and
an actual TVT curve being calculated by converting the actual LWD curve to a TVT depth index at each sample point;
adjust the 2D model based on comparing the second data field and the third data field;
update the 3D model from the 2D model;
analyze the 3D model to determine if the wellbore is on target; and
control steering of a wellbore drilling operation in response to the updated 3D model determining the wellbore is not on target.

22. The non-transitory computer-readable medium of claim 21, wherein the instructions for causing the processing device to adjust the 2D model comprise instructions for causing the processing device to, for a remaining section of the 2D model until an end of the wellbore is reached, the end of the wellbore corresponding with an end of the predicted LWD curve and an end of the actual LWD curve:
adjust at least one of a dip or a fault offset for a section of the 2D model until a segment of the predicted LWD curve matches a corresponding segment of the actual LWD curve or until a segment of actual TVT curve matches a corresponding segment of the predicted TVT log, the segment of the predicted LWD curve that matches the corresponding segment of the actual LWD curve or the segment of the actual TVT curve that matches the corresponding segment of the predicted TVT log representing a correlated segment; and
set a marker at an end of the correlated segment, the marker separating a section of the 2D model that corresponds with the correlated segment from the remaining section of the 2D model.

23. The non-transitory computer-readable medium of claim 22, wherein the instructions for causing the processing device to update the 3D model comprise instructions for causing the processing device to position one or more points on the 3D model, which are usable to adjust the 3D model to fit the 2D model at each point.

24. The non-transitory computer-readable medium of claim 23, the instructions executable by the processing device are further for causing the processing device to set a target line for the wellbore by using the updated 3D model to draw a line beginning at an end of the wellbore to a target point a predetermined distance ahead of the wellbore.

25. The non-transitory computer-readable medium of claim 24, wherein the instructions for causing the processing device to set the target line comprises instructions for causing the processing device to determine the target point represents a target formation.

26. The non-transitory computer-readable medium of claim 25, wherein the instructions for causing the processing device to determine the target point represents the target formation comprises instructions for causing the processing device to automatically update the target formation in response to the 3D model being updated.

\* \* \* \* \*